(12) United States Patent
Kase

(10) Patent No.: US 9,350,343 B2
(45) Date of Patent: May 24, 2016

(54) MULTIPLEX CIRCUIT AND DRIVE UNIT USING THE SAME

(71) Applicant: FUJITSU LIMITED, Kawasaki-shi, Kanagawa (JP)

(72) Inventor: Mariko Kase, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 130 days.

(21) Appl. No.: 14/064,825

(22) Filed: Oct. 28, 2013

(65) Prior Publication Data

US 2014/0159797 A1 Jun. 12, 2014

(30) Foreign Application Priority Data

Dec. 10, 2012 (JP) .................................. 2012-269493

(51) Int. Cl.
*H03K 17/687* (2006.01)
*H03K 17/693* (2006.01)
(52) U.S. Cl.
CPC .................................... *H03K 17/693* (2013.01)
(58) Field of Classification Search
USPC .......................................................... 327/427
See application file for complete search history.

(56) References Cited

U.S. PATENT DOCUMENTS

| | | | |
|---|---|---|---|
| 5,191,234 A * | 3/1993 | Murakami et al. ............ | 327/172 |
| 5,307,067 A | 4/1994 | Kimura et al. | |
| 5,352,987 A * | 10/1994 | Harvey ............................ | 330/51 |
| 5,406,133 A * | 4/1995 | Vora et al. ...................... | 327/108 |
| 6,211,721 B1 * | 4/2001 | Smetana ........................ | 327/407 |
| 6,239,646 B1 * | 5/2001 | Navabi ............... | H03K 17/6264 |
| | | | 327/407 |
| 6,385,214 B1 * | 5/2002 | Kikuchi et al. ............... | 370/537 |
| 6,696,897 B1 * | 2/2004 | Kong et al. ..................... | 331/45 |
| 7,545,188 B1 * | 6/2009 | Xu et al. ........................ | 327/157 |
| 2007/0063687 A1 * | 3/2007 | Zhou ....................... | G05F 3/262 |
| | | | 323/315 |
| 2009/0207645 A1 * | 8/2009 | Parkinson ..................... | 365/145 |
| 2012/0062143 A1 | 3/2012 | Sugawara et al. | |
| 2012/0201289 A1 * | 8/2012 | Abdalla et al. ................ | 375/233 |

FOREIGN PATENT DOCUMENTS

| | | |
|---|---|---|
| JP | 6-29852 | 2/1994 |
| JP | 2012-80061 | 4/2012 |

* cited by examiner

*Primary Examiner* — Lincoln Donovan
*Assistant Examiner* — Patrick Chen
(74) *Attorney, Agent, or Firm* — Staas & Halsey LLP

(57) ABSTRACT

A multiplex circuit includes a plurality of input transistors that correspondingly receive a plurality of input signals of different switching points; a plurality of common base transistors, each common base transistor corresponding to a respective input transistor and having an emitter that is connected in series to a collector of the respective input transistor; and an output end that is connected to a collector of each of the common base transistors, and to which a signal that is obtained by combining signals output by each of the input transistors based on the plurality of input signals.

5 Claims, 12 Drawing Sheets

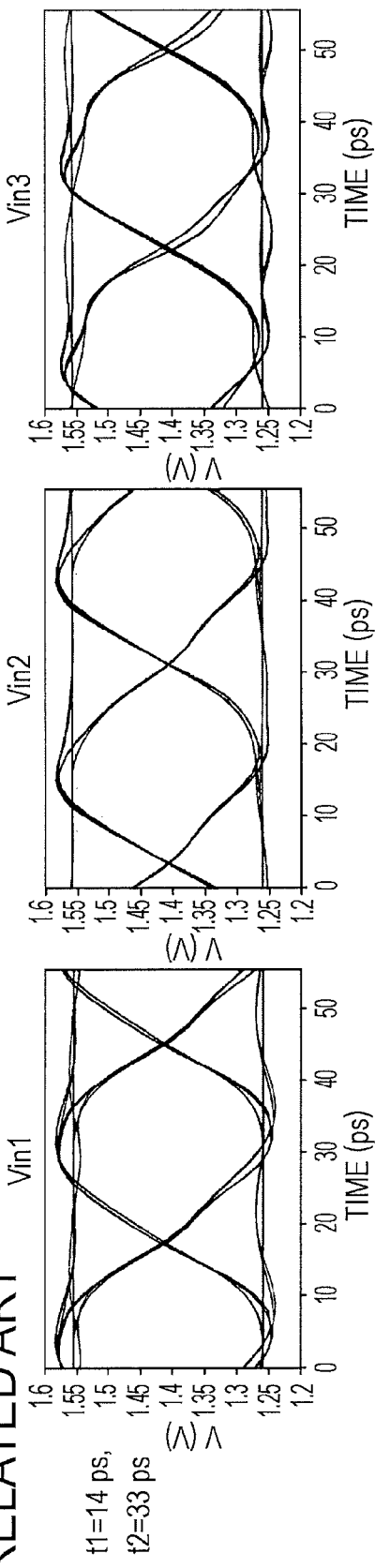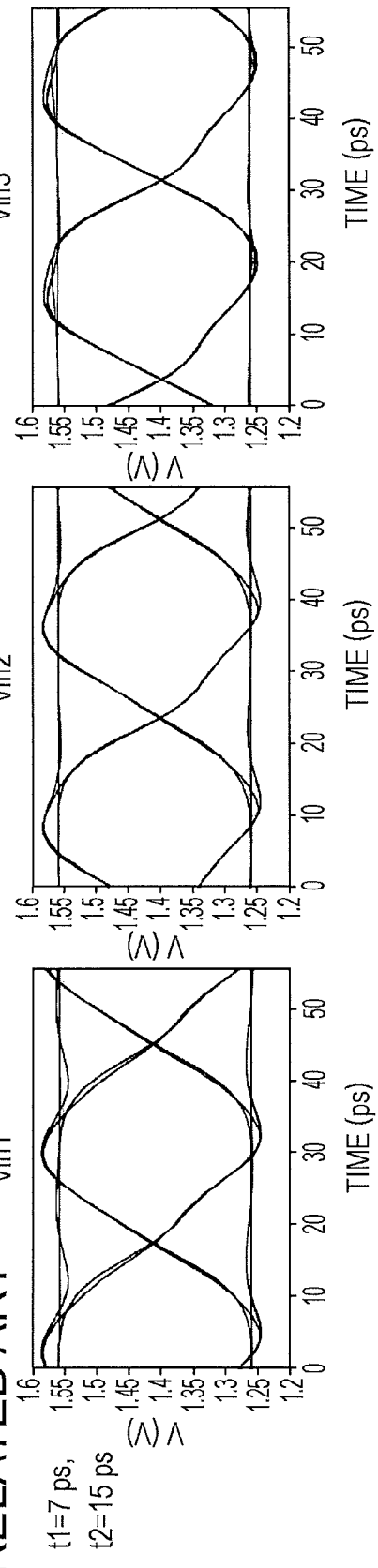
FIG. 3A RELATED ART
t1=14 ps, t2=33 ps
FIG. 3B RELATED ART
t1=7 ps, t2=15 ps

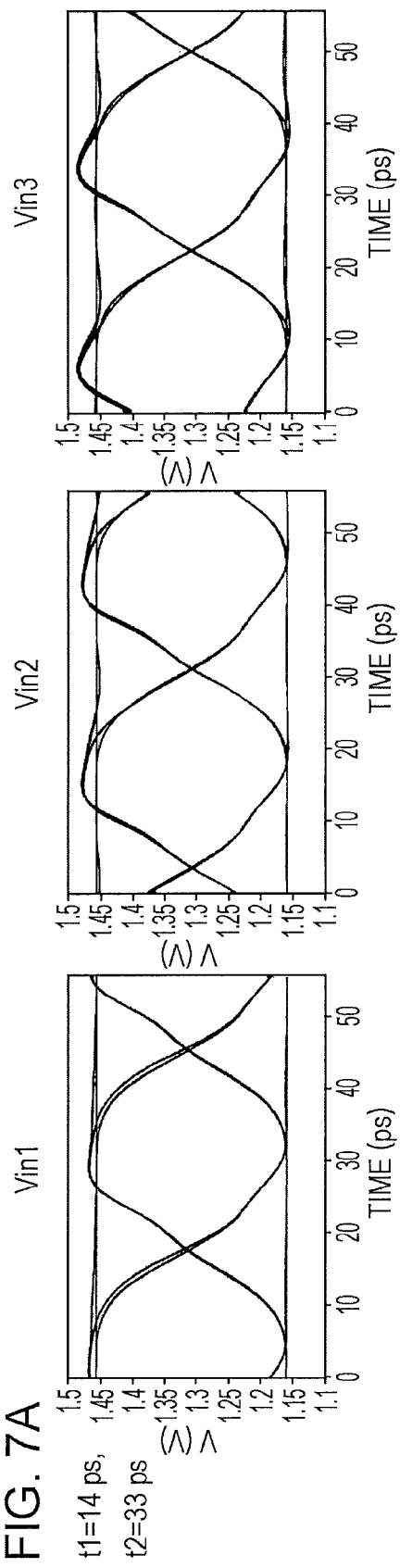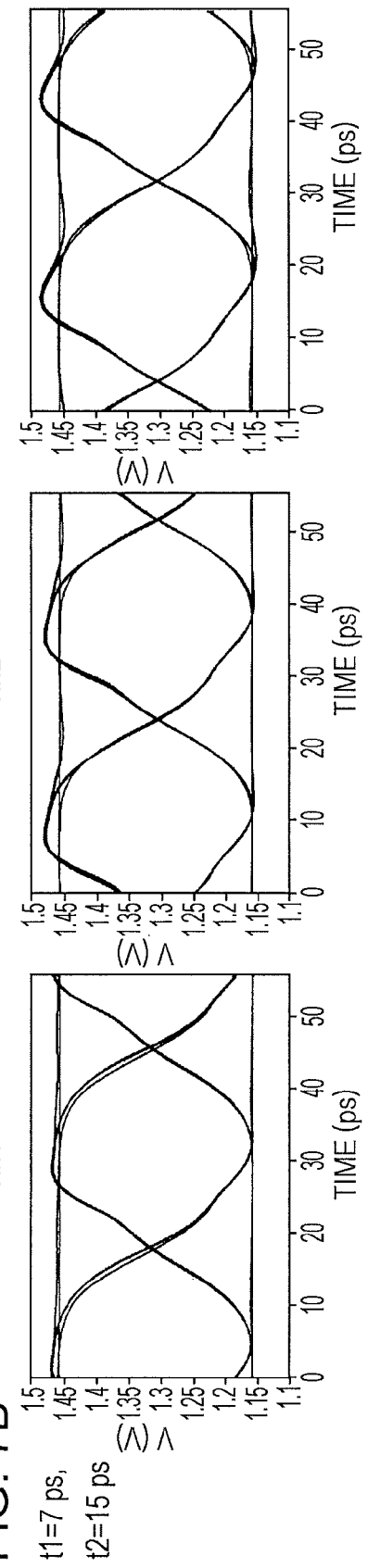

MULTIPLEX CIRCUIT AND DRIVE UNIT USING THE SAME

CROSS-REFERENCE TO RELATED APPLICATION

This application is based upon and claims the benefit of priority of the prior Japanese Patent Application No. 2012-269493, filed on Dec. 10, 2012, the entire contents of which are incorporated herein by reference.

FIELD

The embodiments discussed herein are related to a multiplex circuit and a drive unit using the multiplex circuit, and for example, related to a drive unit that generates a drive signal that drives a light-emitting element by using a multiplex circuit.

BACKGROUND

With a high transmission speed and a large capacity in a network, a method of transmitting and receiving a signal using an optical transmission path has been spread in place of existing electrical wiring.

In order to perform optical transmission at a high speed, a light-emitting element such as a vertical cavity surface emitting laser (VCSEL) is driven at a high speed. A high-frequency signal is attenuated at a transmission path and the waveform is deteriorated, so that a pre-emphasis method of compensating for the signal on the transmission side beforehand has been used.

As a pre-emphasis type drive circuit, there has been proposed a circuit that combines a drive signal and the delayed signal and generates a drive waveform of the VCSEL (For example, see FIG. 11 of Japanese Laid-open Patent Publication No. 2012-080061). A pre-emphasis generation circuit that is used in such a drive circuit generates a pre-emphasis waveform that directly modulates the VCSEL at a high speed by using analog delay (variable delay). The generated pre-emphasis waveforms (a waveform that corresponds to an input drive signal and a waveform that corresponds to the delayed signal) are combined and a VCSEL drive signal is output. In a multiplex circuit, the collector of a transistor to which a drive signal is input and the collector of a transistor to which the delayed signal is input are connected to the common current source, and a synthetic drive signal is obtained from a common output end.

In the above-described multiplex circuit, there is a problem of variation in jitter of input waveforms. The jitter variation is attributed to the occurrence of a crosstalk between inputs of the multiplex circuit and variation in collector potentials because the collector ends of the transistors are connected to the common current source. This is a problem specific to a drive circuit that processes a high-speed signal.

SUMMARY

According to an aspect of the embodiment, a multiplex circuit includes: a plurality of input transistors that correspondingly receive a plurality of input signals of different switching points, the switching points beginning with edges of symbol periods of the plurality of input signals; one of a common base transistor that is connected to a collector of the input transistor, and a common gate transistor that is connected to a drain of the input transistor; and an output end that is connected to one of the collector of the common base transistor and the drain of the common gate transistor, and to which a signal that is obtained by combining the plurality of input signals is output.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 3A and 3B are diagrams illustrating a crosstalk between taps and jitter when analog delay is performed;

FIGS. 7A and 7B are diagrams illustrating a crosstalk reduction effect when the multiplex circuit of FIG. 5 is used;

DESCRIPTION OF EMBODIMENTS

First, the technical problem in the drive circuit in the related art, which is found by the inventor is described.

Figure 1:
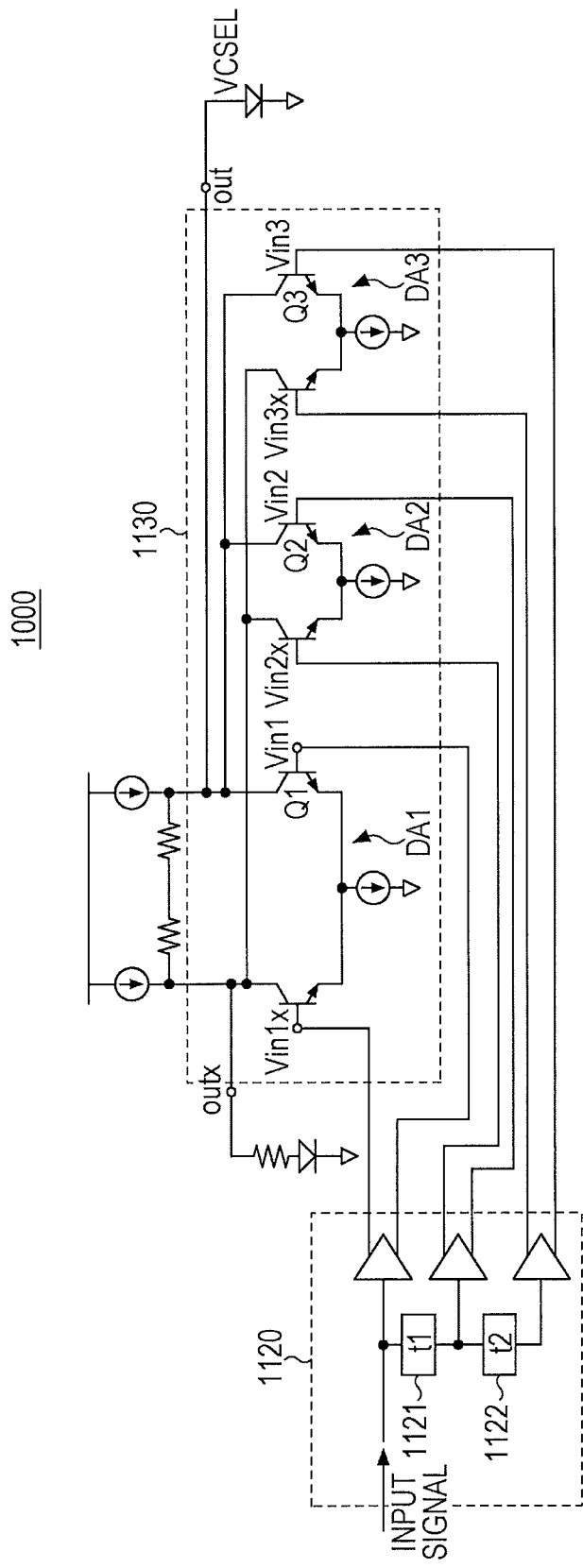
FIG. 1 is a diagram illustrating a configuration of a light-emitting element drive circuit using delay synthesis.
Figure 2A:
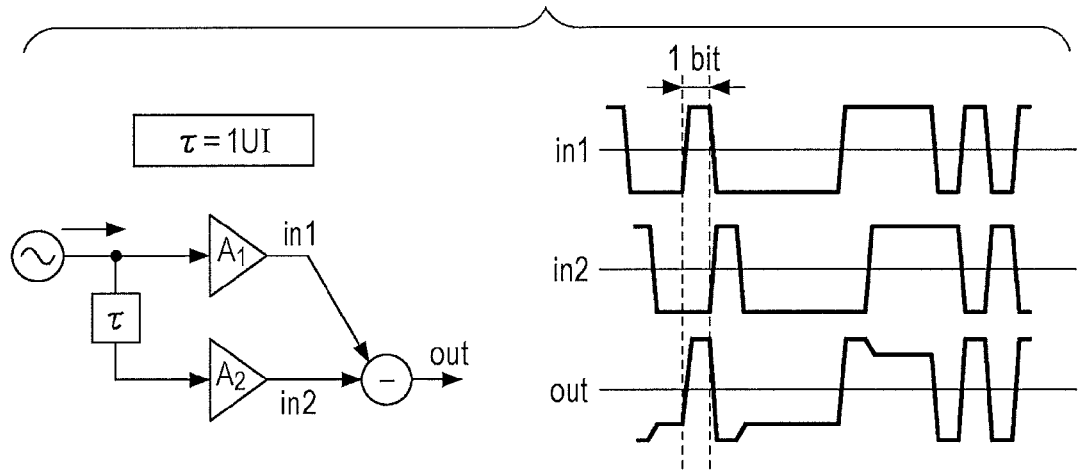
FIGS. 2A and 2B are diagrams illustrating generation of a pre-emphasis waveform that is used in the light-emitting element drive circuit.
Figure 2B:
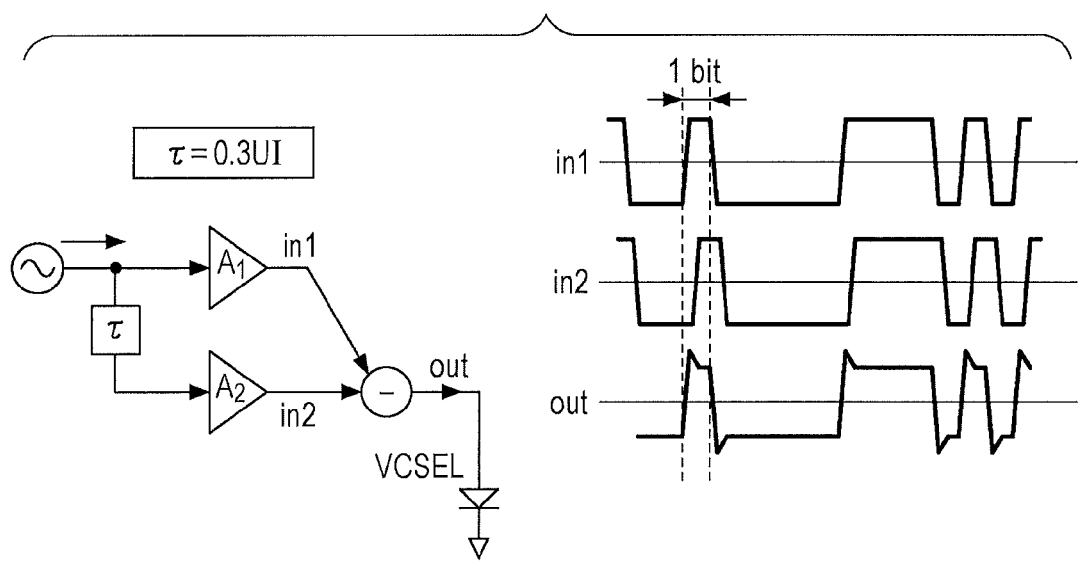

FIGS. 1, 2A, and 2B are diagrams illustrating a crosstalk between input signals of a multiplex circuit. For an input drive signal, a pre-emphasis generation circuit 1120 of a drive unit 1000 assigns a delay time t1 at a delay circuit 1121, assigns a delay time t2 at a delay circuit 1122, and outputs three types of differential signals. A first differential signal is input to a first differential amplifier unit DA1 of a multiplex circuit 1130, a second differential signal is input to a second differential amplifier unit DA2 of the multiplex circuit 1130, a third differential signal is input to a third differential amplifier unit DA3 of the multiplex circuit 1130, and these signals are combined with each other.

As illustrated in FIG. 2A, in a general pre-emphasis generation circuit that is used for loss correction and the like of an electrical signal, delay τ is set to an integer multiple of a phase (1 bit time). Therefore, all of input without delay (in1 that is amplified by amplifier A1), delay input (in2 that is amplified by amplifier A2), and output (out) are switched at the same point in time.

In addition, as illustrated in FIG. 2B, in a VCSEL characteristic, a signal is not sufficiently compensated by general integer bit delay, so that analogue delay is used in this case.

For example, when the delay τ is set to a decimal multiple of a phase, a switching point of the signal is different between the input without delay (in1) and the delay input (in2).

FIGS. 3A and 3B illustrate monitor waveforms of voltage signals Vin1, Vin2, and Vin3 that are respectively applied to input transistors Q1, Q2, and Q3 of the multiplex circuit 1130 when the delay times t1 and t2 are changed not in an integer-bit fashion but in an analog fashion by the drive circuit in FIG. 1. FIG. 3A illustrates a case in which the delay time t1 is set at 14 ps, and the delay time t2 is set at 33 ps, and FIG. 3B illustrates a case in which the delay time t1 is set at 7 ps, and the delay time t2 is set at 15 ps.

Ideally, each of the waveforms is not to be changed even when the delay times t1 and t2 are changed. However, practically, the appearance of jitter is change. It is conceivable that this is why signals the switching points of which are shifted at the taps are input to the multiplex circuit 1130 ("in1", "in2", and "in3"), and a crosstalk occurs between the inputs.

Figure 4:
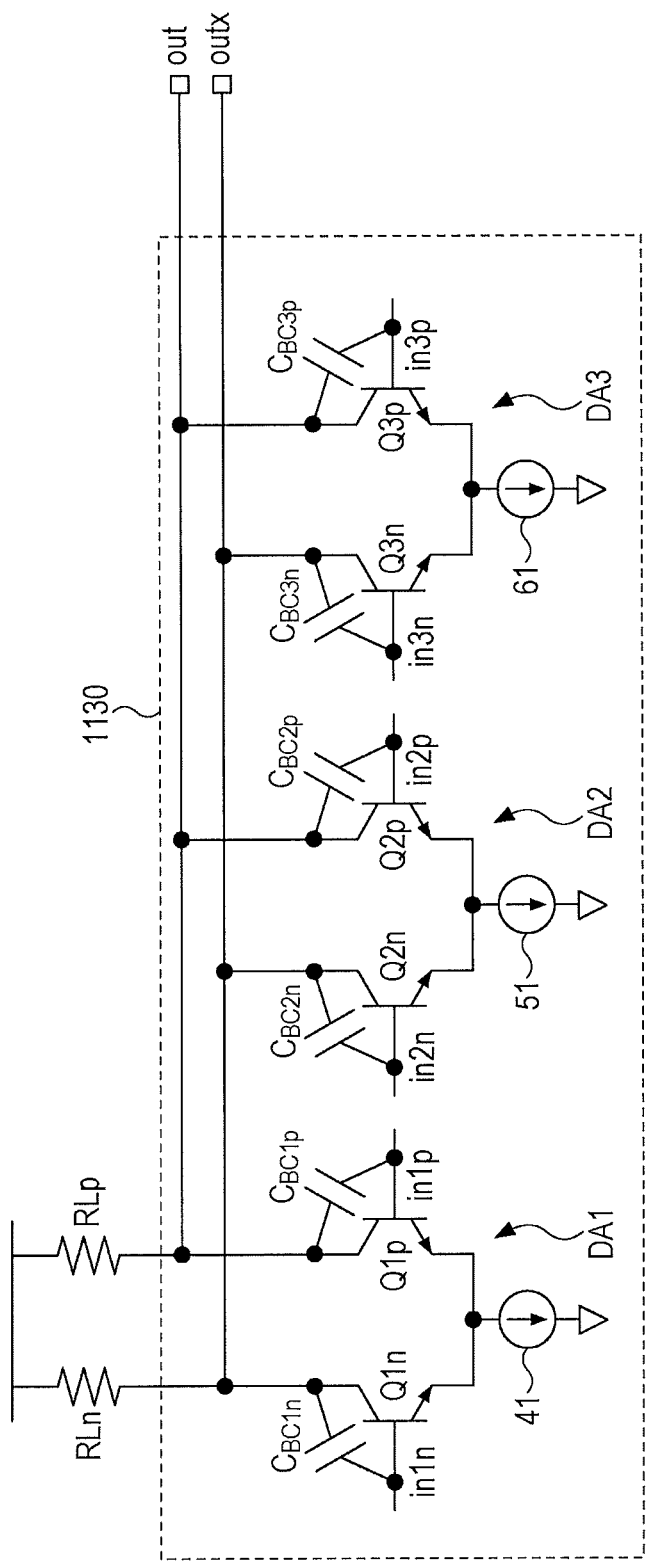
FIG. 4 is a diagram illustrating definition of a crosstalk between inputs.

FIG. 4 is a diagram illustrating definition of a crosstalk between inputs. In differential amplifier units DA1, DA2, and DA3 of the multiplex circuit 1130, the potential of the collector end of base-to-collector parasitic capacitance $C_{BC}$ in each of input transistors Q1p, Q1n, Q2p, Q2n, Q3p, and Q3n is shaken by a signal of another tap. As described above, mutual influence of high-speed signals through the base-to-collector parasitic capacitance $C_{BC}$ of the input transistor Q is referred to as "crosstalk between inputs".

For example, when there is no signal at "in1" and "in3", and a signal is input at "in2" (for convenience, a positive-phase signal and a negative-phase signal are collectively described), a current signal that flows through the transistor Q2 is converted into a voltage signal by a resistor RL, and the potential of the output end out is shaken. Between the transistors Q1, Q2, and Q3, the collector end (drain end in a case of a field-effect transistor (FET)) and the output end are shared, so that a high-speed component of the voltage signal of the output end out is leaked into "in1" and "in3" through the parasitic capacitance $C_{BC}$. As a result, current that flows through the transistors Q1 and Q3 is not to be changed, however the potential is shaken by the signal that is input to "in2" undesirably.

In the case of general integer bit delay (see FIG. 2A), switching points of signals of the respective tap are matched with each other, so that the impact on the final synthetic waveform is small even when a crosstalk between inputs occurs. However, when signals of switching points that are different due to analog delay are combined as in the light-emitting element drive circuit, the signals appear as variation in jitter as illustrated in FIGS. 3A and 3B, depending on a delay amount.

Therefore, in the embodiments, a configuration is proposed in which the collector (drain) potential of the input transistor is stabilized, that is, a crosstalk between the taps may be avoided without the impact from another input. For example, a common base transistor is arranged between the output end and the collector end of each of the input transistors Q1 to Q3 of the taps to which a drive signal and the delayed signal are input to suppress variation in collector potentials of the input transistors. When an FET is used, a common gate transistor is arranged between the output end and the drain end of each of the input transistors T1 to T3 to suppress variation in drain potentials of the input transistors.

Specific configuration examples of the embodiments are described below with reference to accompanying drawings.

Figure 5:
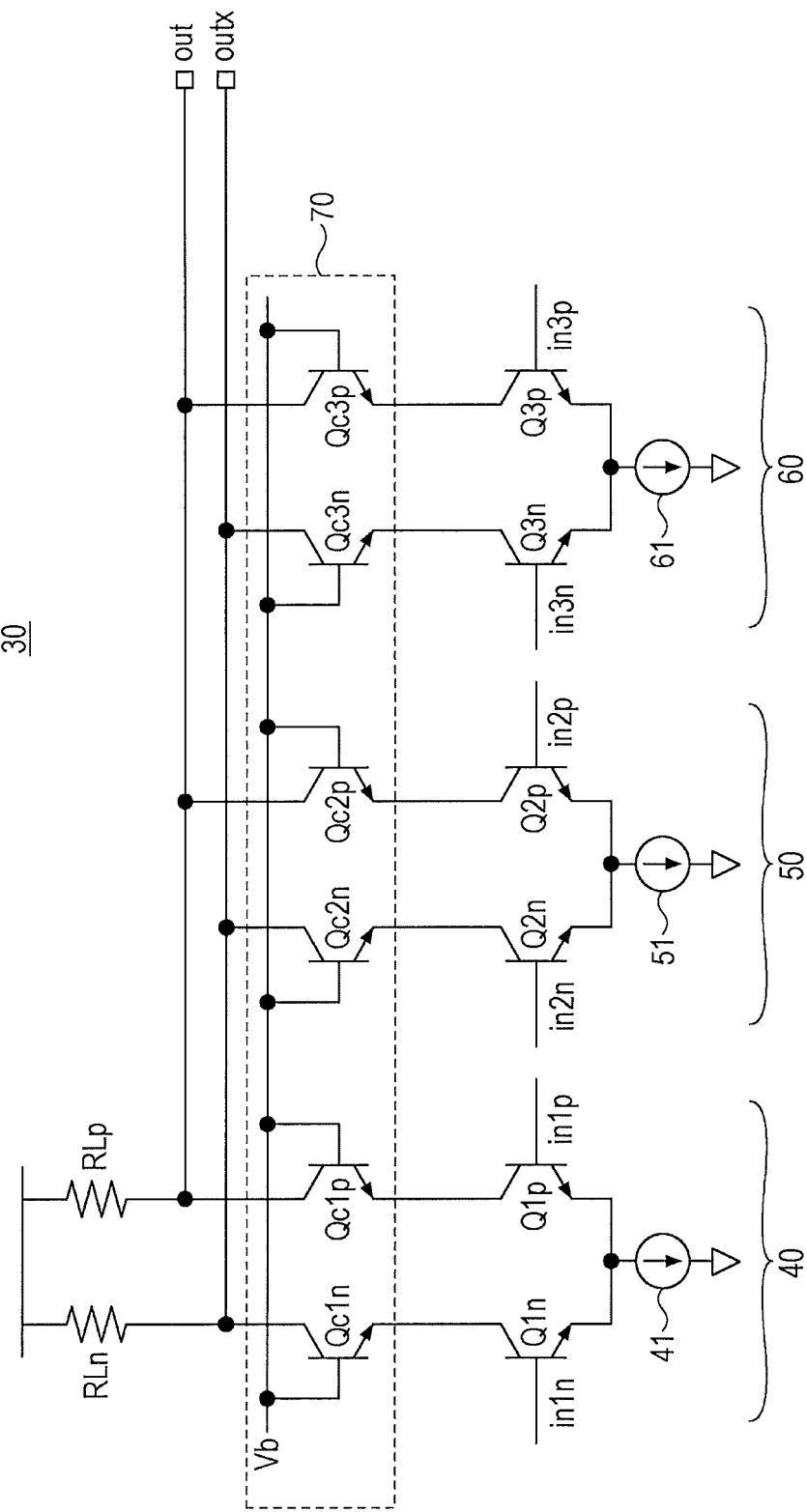
FIG. 5 is a diagram illustrating a configuration example of a multiplex circuit according to a first embodiment.

FIG. 5 is a diagram illustrating a configuration example of a multiplex circuit 30 according to a first embodiment. The multiplex circuit 30 includes a cascode stage 70 that is inserted between the output ends out/outx and the collector end of input transistors Q1p, Q1n, Q2p, Q2n, Q3p, and Q3n (hereinafter collectively referred to as "input transistor Q" or "input transistors Q1, Q2, and Q3"). In the cascode stage 70, common base transistors Qc1p, Qc1n, Qc2p, Qc2n, Qc3p, and Qc3n (hereinafter collectively referred to as "common base transistor Qc") are respectively connected to the corresponding input transistors Q in series. The bases of common base transistors Qc are connected to a potential Vb in common. The potential Vb is potential that is desired to pass the same amount of current through each of the common base transistors Qc when current flows through each of the input transistors Q.

By arranging the common base transistor Qc between the collector end of the input transistor Q and the output end, variation in potentials Vc of the collector ends of the input transistors may be suppressed.

The multiplex circuit 30 includes a first differential amplifier unit 40 that performs differential amplification on a drive signal, a second differential amplifier unit 50 that performs differential amplification on the first delayed signal, and a third differential amplifier unit 60 that performs differential amplification on the second delayed signal.

From a pre-emphasis generation circuit that is described later, a positive-phase signal of a drive signal is input to the input transistor Q1p of the first differential amplifier unit 40 (int p), and a negative-phase signal of the drive signal is input to the input transistor Q1n of the first differential amplifier unit 40 (in1n). The emitter of the input transistor Q1p and the emitter of the input transistor Q1n are connected to a current source 41. The other end of the current source 41 is grounded. The collector of the input transistor Q1p is connected to the emitter of the cascode transistor (common base transistor) Qc1p, and the collector of the input transistor Q1n is connected to the emitter of the cascode transistor (common base transistor) QC1n. The collector of the common base transistor Qc1p is connected to a resistor RLp and the output end out. The collector of the common base transistor Qc1n is connected to a resistor RLn and the output end outx.

A positive-phase signal of the first delayed signal that is obtained by delaying the drive signal by a time t1 is input to the input transistor Q2p of the second differential amplifier unit 50 (in2p), and a negative-phase signal of the first delayed signal is input to the input transistor Q2n of the second differential amplifier unit 50 (in2n). The emitter of the input transistor Q2p and the emitter of the input transistor Q2n are connected to a current source 51. The other end of the current source 51 is grounded. The collector of the input transistor Q2p is connected to the emitter of the cascode transistor (common base transistor) Qc2p, and the collector of the input transistor Q2n is connected to the emitter of the cascode transistor (common base transistor) Qc2n. The collector of the common base transistor Qc2p is connected to the resistor RLp and the output end out. The collector of the common base transistor Qc2n is connected to the resistor RLn and the output end outx.

A positive-phase signal of the second delayed signal that is obtained by delaying the drive signal by a time t2 is input to the input transistor Q3p of the third differential amplifier unit 60 (in3p), and a negative-phase signal of the second delayed signal is input to the input transistor Q3n of the third differential amplifier unit 60 (in3n). The emitter of the input transistor Q3p and the emitter of the input transistor Q3n are connected to a current source 61. The other end of the current source 61 is grounded. The collector of the input transistor Q3p is connected to the emitter of the cascode transistor (common base transistor) Qc3p, and the collector of the input transistor Q3n is connected to the emitter of the cascode transistor (common base transistor) Qc3n. The collector of the common base transistor Qc3p is connected to the resistor RLp and the output end out. The collector of the common base transistor Qc3n is connected to the resistor RLn and the output end outx.

When a base-emitter potential difference of the common base transistor Qc is represented as "$V_{BE}$", a collector potential Vc of the input transistor is represented by "Vc=Vb−$V_{BE}$". "Vb" is invariable, and base-emitter voltage $V_{BE}$ of each of the common base transistor Qc is also substantially invariable, so that the collector potential Vc of the input transistor is stabilized.

Figure 6A:
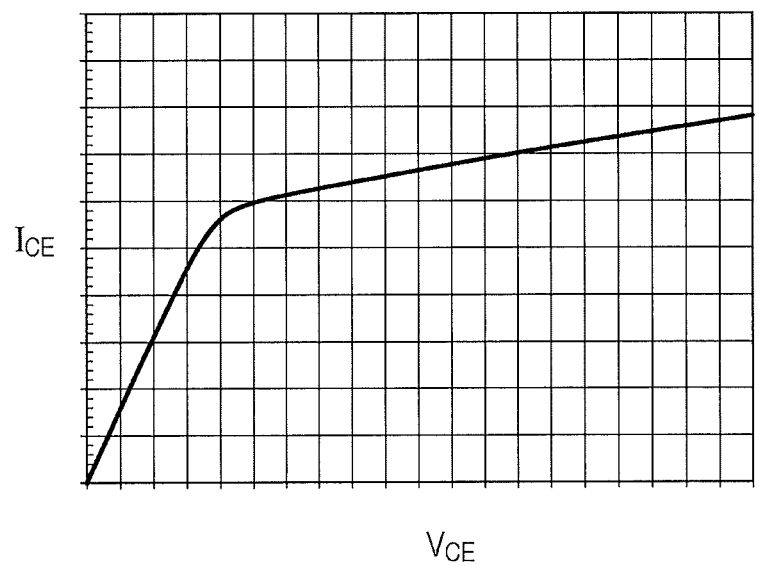
FIGS. 6A and 6B are diagrams illustrating a current-voltage characteristic of a common base transistor that is used in the multiplex circuit of FIG. 5.
Figure 6B:
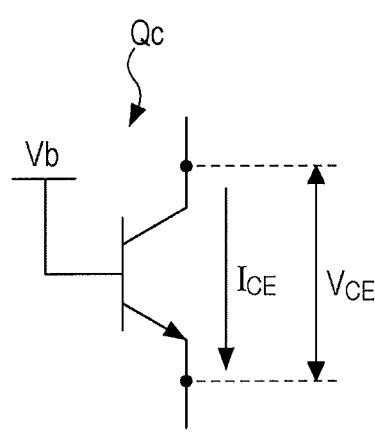

FIGS. 6A and 6B are diagrams illustrating a current-voltage characteristic of the common base transistor Qc that is used in FIG. 5, and a relationship between current $I_{CE}$ and voltage $V_{CE}$ in the common base transistor Qc. The horizontal axis indicates the collector-emitter voltage $V_{CE}$ of the transistor Qc, and the vertical axis indicates the collector-emitter current $I_{CE}$ of the transistor Qc. With an increase in the voltage $V_{CE}$ due to the early effect, the current $I_{CE}$ slightly increases without hard saturation. Therefore, when the potential of the output end (out/outx) of the multiplex circuit 30, that is, the collector potential of the common base transistor (cascode transistor) Qc is changed, the current that flows through the common base transistor Qc is slightly changed. When the current "$I_{CE}$" is slightly changed in accordance with the transistor characteristic of FIG. 6, the collector potential Vc of the input transistor Q is slightly shaken, so that a crosstalk between inputs is not removed completely. However, the crosstalk is sufficiently suppressed as compared with the circuit configuration in the related art.

FIGS. 7A and 7B are diagrams illustrating jitter suppression effect of the circuit of FIG. 5. FIG. 7A illustrates a case in which the delay time t1 is set at 14 ps, and the delay time t2 is set at 33 ps similar to FIG. 3A, and FIG. 7B illustrates a case in which the delay time t1 is set at 7 ps, and the delay time t2 is set at 15 ps similar to FIG. 3B. As compared with FIGS. 3A and 3B, variation in jitter is suppressed in all input waveforms Vin1, Vin2, and Vin3 of the input transistors Q1, Q2, and Q3 of the multiplex circuit 30 even when the delay time is changed.

Figure 8:
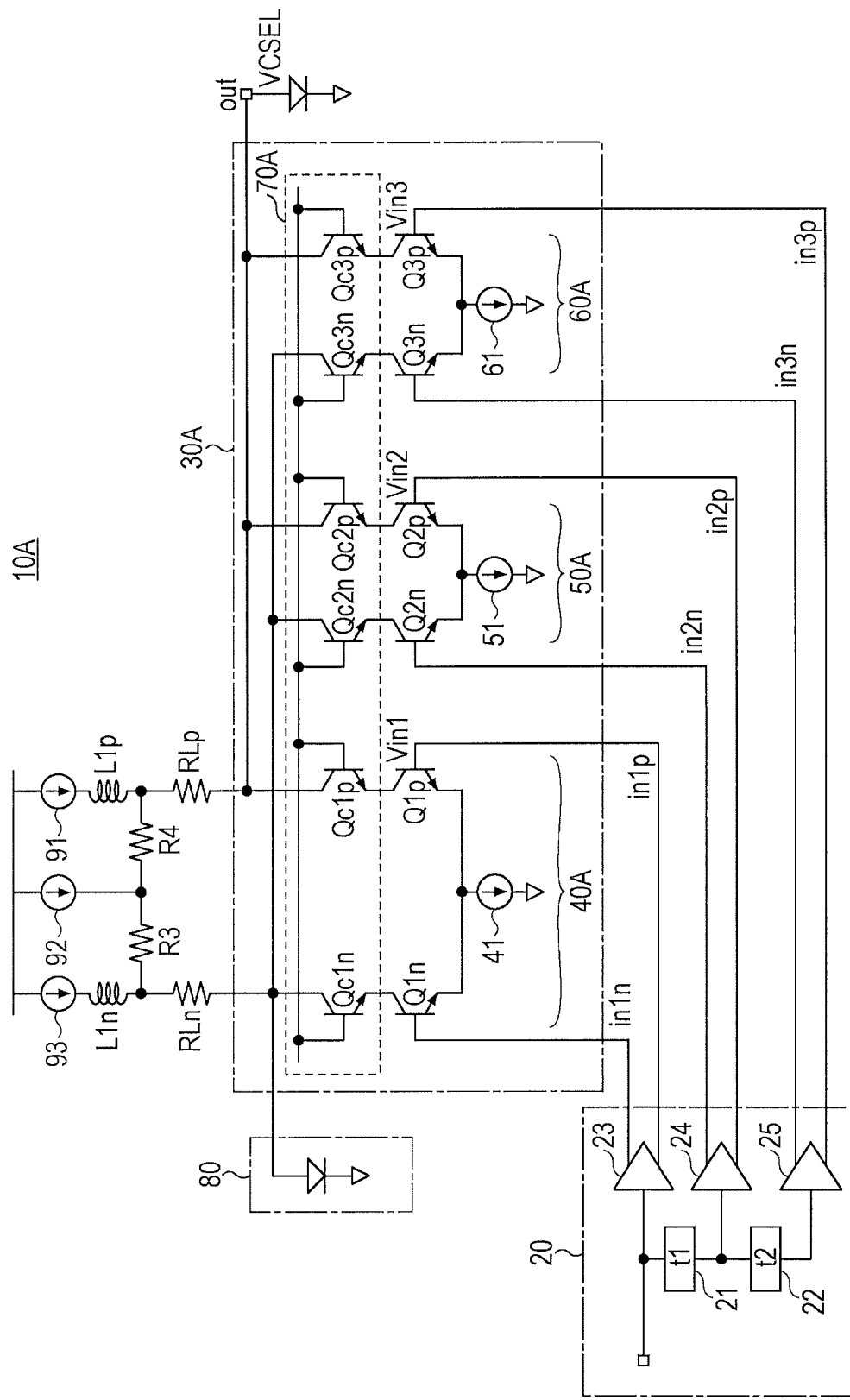
FIG. 8 is a diagram illustrating a configuration example of a drive circuit that employs the multiplex circuit of FIG. 5.

FIG. 8 is a diagram illustrating a configuration example of a drive unit 10A in which a multiplex circuit 30A that is similar to the multiplex circuit 30 in FIG. 5 is used. The drive unit 10A includes a pre-emphasis generation circuit 20, the multiplex circuit 30A, and a dummy load 80. One output (positive-phase signal) of the multiplex circuit 30A is connected to a VCSEL through an output end out. The other output (negative-phase signal) is connected to the dummy load 80.

A cascode stage 70A is inserted between an output end and the collectors of input transistors Q of the multiplex circuit 30A. The collectors of common base transistors Qc1p, Qc2p, and Qc3p of the cascode stage 70A are connected to the output end out in common, and connected to a bias current source 91 through a resistor RLp and an inductor L1p. The collectors of common base transistors Qc1n, Qc2n, and Qc3n are connected to the dummy load 80 in common, and connected to a bias current source 93 through a resistor RLn and an inductor L1n.

A resistor R4 is connected to a node between the resistor RLp and the inductor L1p, a resistor R3 is connected to a node between the resistor RLn and the inductor L1n, and the resistor R3 and the resistor R4 are connected to each other in series. A node between the resistors R3 and R4 is connected to a bias current source 92. The bias current source 92 changes bias current and controls current that flows through the VCSEL and the dummy load. The dummy load 80 has a characteristic that is similar to that of the VCSEL, and a connection point between the resistors R3 and R4 may be regarded as a virtual ground point, so that, by using the resistors R3 and R4, and the resistors RLn and RLp, output impedance of the drive unit 10A is matched with input impedance of the VCSEL and input impedance of the dummy load 80.

The pre-emphasis generation circuit 20 includes a first delay circuit 21, a second delay circuit 22, a first amplifier 23, a second amplifier 24, and a third amplifier 25. The first delay circuit 21 delays an input drive signal by "t1" and outputs the first delayed signal. The second delay circuit 22 further delays the output first delay circuit 21 and outputs the second delayed signal that includes the delay amount t2.

The first amplifier 23 generates differential signals on the basis of the input drive signal and inputs differential signals in1p and in1n to the input transistors Q1p and Q1n of the first differential amplifier unit 40A of the multiplex circuit 30A, respectively. The second amplifier 24 generates differential signals on the basis of the first delayed signal and inputs differential signals in2p and in2n to the input transistors Q2p and Q2n of the second differential amplifier unit 50A, respectively. The third amplifier 25 generates differential signals on the basis of the second delayed signal and inputs differential signals in3p and in3n to the input transistors Q3p and Q3n of the third differential amplifier unit 60A, respectively.

When the signals to which the delay differences are given in the pre-emphasis generation circuit 20 are combined in the multiplex circuit 30A, output of a VCSEL drive signal is performed in a state in which the rise and fall of the drive signal are corrected (emphasized or suppressed) beforehand.

In the drive unit 10A, by arranging the common base transistor between the output end and the collector of the input transistor Q of the multiplex circuit 30A, variation in collector potentials of the input transistors Q is reduced.

Figure 9:
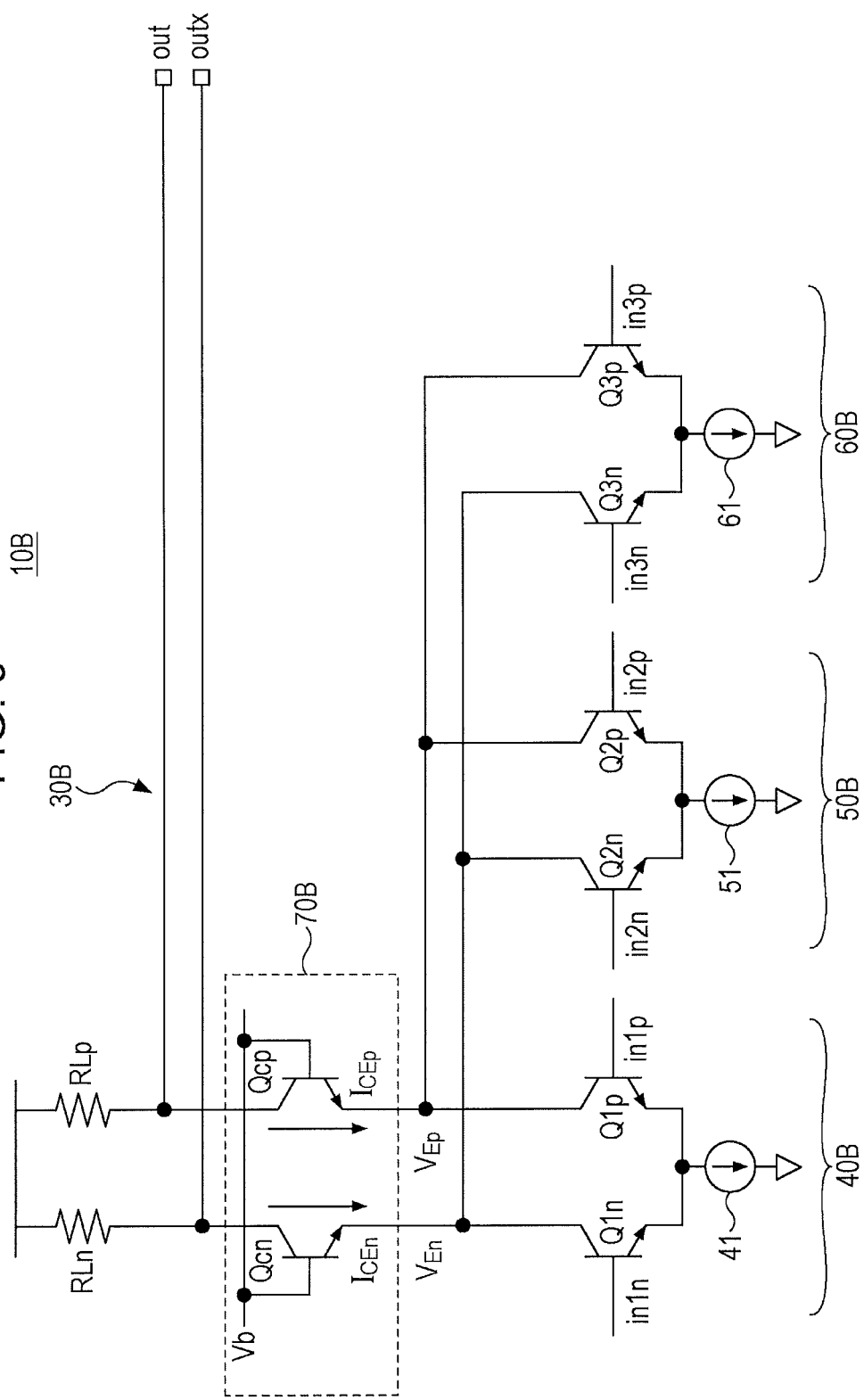
FIG. 9 is a diagram illustrating a configuration example of a drive circuit according to a second embodiment.

FIG. 9 is a diagram illustrating a configuration example of a drive unit 10B according to a second embodiment. The drive unit 10B includes a multiplex circuit 30B. The illustration of a pre-emphasis generation circuit 20 that generates a differential input signal is omitted from the multiplex circuit 30B, however the circuit that is similar to the pre-emphasis generation circuit 20 in FIG. 8 is connected to the multiplex circuit 30B.

In the multiplex circuit 30B according to the second embodiment, a cascode stage 70B that is used in common is arranged between the collector ends and the output ends of input transistors Q1, Q2, and Q3.

The collectors of the input transistors Q1p, Q2p, and Q3p are connected to the emitter of a common base transistor Qcp in common. The collectors of the input transistors Q1n, Q2n, and Q3n are connected to the emitter of the common base transistor Qcn in common.

The emitter of the common base transistor (cascode transistor) Qc is shared among the plurality of taps, so that the sizes of the common base transistors Qcp and Qcn that are connected to the output ends may be reduced. The parasitic capacitance when viewed from the output end becomes small, thereby being advantageous to a high-speed operation.

Figure 10A:
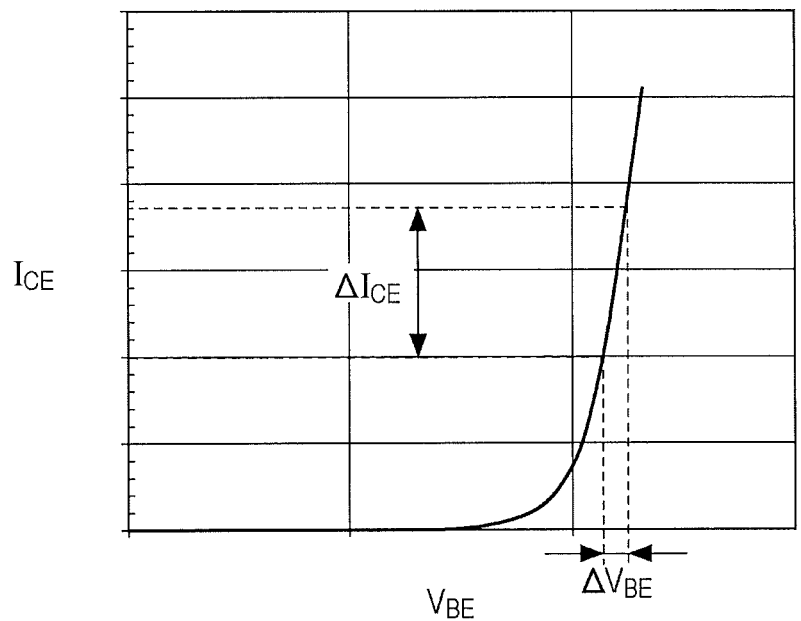
FIGS. 10A and 10B are diagrams illustrating a current-voltage characteristic of a common base transistor that is used in the drive circuit according to the second embodiment.
Figure 10B:
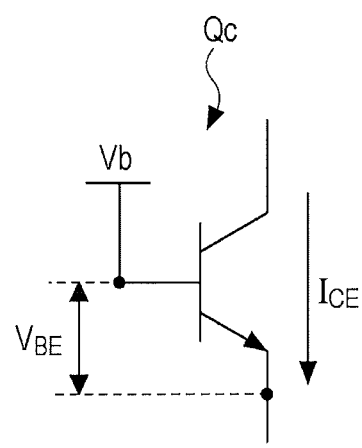

FIG. 10A is a diagram illustrating a characteristic of the common base transistor Qc in FIG. 9. In FIG. 10B, the horizontal axis indicates base-emitter voltage $V_{BE}$ of the common base transistor Qc, and the vertical axis indicates collector-emitter current $I_{CE}$ of the common base transistor Qc. When a signal is input to the input end of the input transistor Q, a combined current signal $I_{CE}$ flows though the common base transistor Qc. A change amount $\Delta V_{BE}$ of $V_{BE}$ is negligibly small as compared with a change amount $\Delta I_{CE}$ of $I_{CE}$, so that variation in potentials of common collector ends of the input transistors Q is small even when a current signal flows through the common base transistor Qc.

Figure 11:
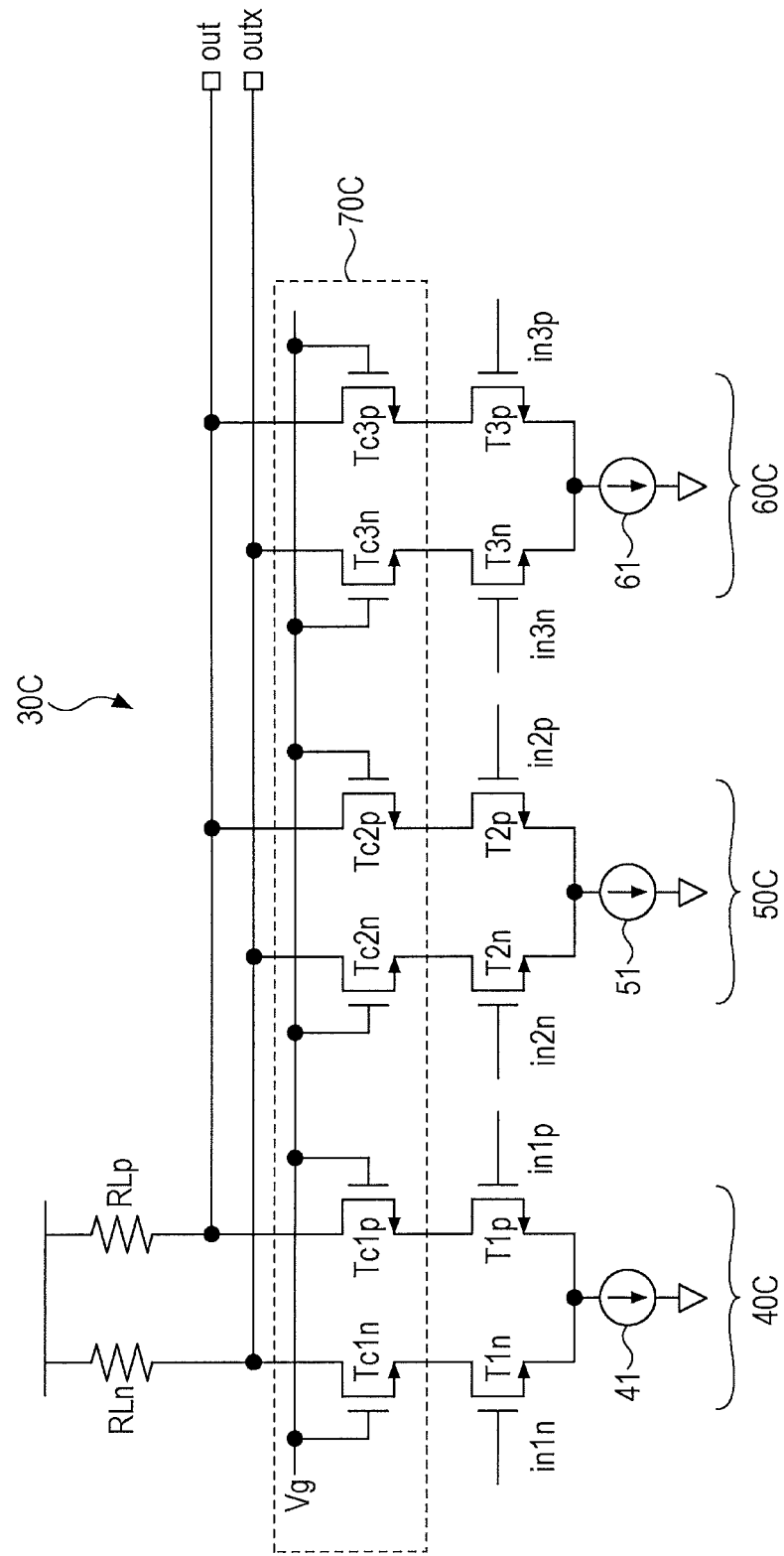
FIG. 11 is a diagram illustrating a configuration example of a drive circuit according to a third embodiment.

FIG. 11 is a diagram illustrating a configuration of a drive unit 10C according to a third embodiment. The drive unit 10C includes a multiplex circuit 30C. The illustration of a pre-emphasis generation circuit 20 that generates a differential input signal is omitted from to the multiplex circuit 30C, however the circuit that is similar to the pre-emphasis generation circuit 20 in FIG. 8 is connected to the multiplex circuit 30C.

The multiplex circuit 30C according to the third embodiment uses an FET instead of a bipolar transistor. The multiplex circuit 30C includes a first differential amplifier unit 40C, a second differential amplifier unit 50C, and a third differential amplifier unit 60C. A differential signal of an input drive signal is input to the first differential amplifier unit 40C (in1p and in1n). A differential signal of the first delayed signal is input to the second differential amplifier unit 50C (in2p and in2n). A differential signal of the second delayed signal is input to the third differential amplifier unit 60C (in3p and in3n).

The multiplex circuit 30C includes a cascode stage 70C that is inserted between the output ends out/outx and the collector ends of input transistors T1n, T1p, T1n, T2p, T2n, T3p, and T3n (hereinafter collectively referred to as "input transistor T" or "input transistors T1, T2, and T3"). In the cascode stage 70C, common gate transistors Tc1p, Tc1n, Tc2p, Tc2n, Tc3p, and Tc3n (hereinafter collectively referred to as "common gate transistor Tc") are respectively connected to the corresponding input transistors T in series. The gates of the common gate transistors Tc are connected to a potential Vg in common. The potential Vg is potential that is desired to pass the same amount of current through the common gate transistors Tc when current flows through the input transistors T.

By connecting the common gate transistor Tc between the drain of the input transistor Q and the output end, variation in potentials $V_D$ of the drain ends of the input transistors is suppressed.

When gate-to-source threshold voltage of the common gate transistor Tc is represented as Vth, the drain potential $V_D$ of the input transistor may be represented by "$V_D$=Vg−Vth". "$V_D$" is invariable, and the gate-to-source voltage Vth of each of the common gate transistors Qc is also substantially invariable, so that the drain potential $V_D$ of the input transistor is stabilized.

Figure 12:
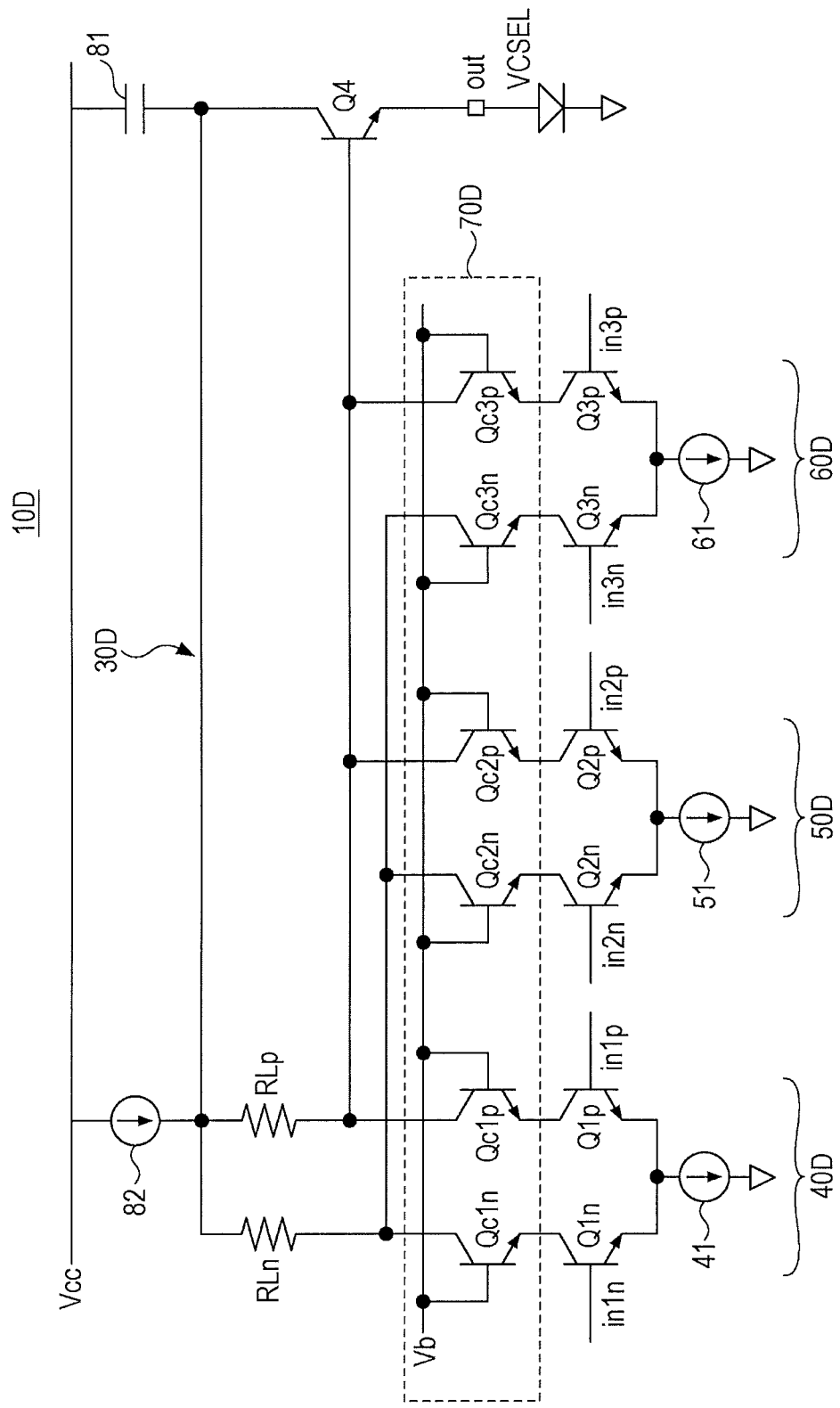
FIG. 12 is a diagram illustrating a configuration example of a drive circuit according to a fourth embodiment.

FIG. 12 is a diagram illustrating a configuration of a drive unit 10D according to a fourth embodiment. The drive unit 10D includes a multiplex circuit 30D. The illustration of a pre-emphasis generation circuit 20 that generates a differential input signal is omitted from to the multiplex circuit 30D, however the circuit that is similar to the pre-emphasis generation circuit 20 in FIG. 8 is connected to the multiplex circuit 30D. The drive unit 10D is an emitter follower type output drive unit.

The collectors of input transistors Q1p, Q2p, and Q3p are respectively connected to the emitters of the corresponding common base transistors Qc1p, Qc2p, and Qc3p. The collectors of the common base transistors Qc1p, Qc2p, and Qc3p are connected to one end side of a resistor RLP, and connected to the base of a transistor Q4 in common. The other end of the resistor RLP is connected to a current source 82 and the collector of the transistor Q4.

The collectors of input transistors Q1n, Q2n, and Q3n are respectively connected to the emitters of the corresponding common base transistors Qc1n, Qc2n, and Qc3n. The collectors of common base transistors Qc1n, Qc2n, and Qc3n are connected to one end side of a resistor RLn. The other end of the resistor RLn is connected to the current source 82 and the collector of the transistor Q4.

The collector of the transistor Q4 is connected to a reference potential Vcc through a capacity 81. When a synthetic signal of outputs of the input transistors Q1 to Q3 is input to the base of the transistor Q4, a signal that reflects directly the amplitude of the base is output from the emitter of the transistor Q4. As described above, the transistor Q4 functions as an emitter follower. The emitter output of the transistor Q4 drives the VCSEL that is connected to the output end out.

Such a configuration does not desire a dummy load, so that redundant current (current that flows through the dummy load) does not occur.

The capacity of the current source 82 is not seen from the output end out, thereby being advantageous to the speedup. In the configuration in FIG. 8, the bias current source 91 is connected to the output end out through the resistor RL and the inductor L1. The bias current source is constituted by the FET and it appears that the parasitic capacitance is hanging in the output end out. On the contrary, in the fourth embodiment, the transistor Q4 functions as a buffer, so that the capacity of the current source 82 is lighten up and the high-speed drive may be performed.

In such a configuration, the cascode connection of the common base transistor Qc is performed on the collector of the input transistor Q, so that the collector potentials of the input transistors Q are stabilized.

In the drive unit of the above-described embodiments, even when signals that are obtained by performing analog delay (variable delay adjustment) are combined in order to achieve high-speed drive of the VCSEL, a crosstalk between input signals may be reduced and variation in jitter may be suppressed.

In the first embodiment to the fourth embodiment, the pre-emphasis generation circuit 20 that includes three taps is employed, and the number of taps is not limited as long as the pre-emphasis generation circuit 20 includes a plurality of taps. The light-emitting element is not limited to the VCSEL, and the drive unit may drive any light-emitting element that oscillates at high speed. Any combination of the first embodiment to the fourth embodiment may be performed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. A drive unit, comprising:
 a pre-emphasis generation circuit that generates a plurality of signal waveforms of different switching points, the switching points being configured to be set as edges of the plurality of signal waveforms; and
 a multiplex circuit that generates a drive signal by combining the plurality of signal waveforms that are output from the pre-emphasis generation circuit, and wherein the multiplex circuit includes:

a plurality of input transistors that uses the plurality of signal waveforms as inputs;

a plurality of gate transistors, each gate transistor being connected to a drain of a respective input transistor of the plurality of input transistors;

an output end that is connected to a drain of each of the gate transistors, and to the drive signal that drives an external light-emitting element is output; and at least one common drain transistor, a gate of which is connected to the drain of each of the gate transistors and a source of which is connected to the output end.

2. The drive unit according to claim 1, wherein the switching points are configured to be edges of one bit times of the plurality of signal waveforms.

3. The drive unit according to claim 1, wherein one of the plurality of input transistors receives a signal waveform that corresponds to an input drive signal, and another one of the plurality of input transistors receives a delayed signal that is obtained by performing analog delay adjustment on the input drive signal.

4. The drive unit according to claim 1, wherein the drain of each of the at least one common drain transistor is connected to a power source through a load resistor.

5. The drive unit according to claim 1, wherein the drain of each of the at least one common drain transistor is connected to a power source through a direct current source.

* * * * *